US006129577A

United States Patent [19]

Daoud

[11] Patent Number: 6,129,577

[45] **Date of Patent: *Oct. 10, 2000**

[54] CONNECTOR TESTING SYSTEM HAVING CONNECTOR LATCHING

[75] Inventor: Bassel H. Daoud, Parsippany, N.J.

[73] Assignee: Lucent Technologies Inc., Murray Hill, N.J.

[ * ] Notice: This patent is subject to a terminal disclaimer.

[21] Appl. No.: 09/217,093

[22] Filed: Dec. 21, 1998

[51] Int. Cl.[7] .................................................... H01R 13/15

[52] U.S. Cl. .......................... 439/482; 324/761; 324/754; 324/72.5; 439/272; 439/261; 439/426; 439/912

[58] Field of Search .................................... 439/426, 427, 439/387, 912, 142, 135, 137, 482, 396, 272, 261; 324/761, 72.5, 754

[56] References Cited

U.S. PATENT DOCUMENTS 3,571,779 3/1971 Collier .................................... 439/587
3,885,850 5/1975 Witte et al. ............................ 439/346
3,918,784 11/1975 Lemke et al. ............................ 439/70
4,232,924 11/1980 Kline et al. ............................ 439/74
4,947,115 8/1990 Siemon et al. .......................... 324/761

FOREIGN PATENT DOCUMENTS 0 366 353 A1 2/1990 European Pat. Off. .......... G01R 1/04

*Primary Examiner*—Brian Sircus
*Assistant Examiner*—Michael C. Zarroli
*Attorney, Agent, or Firm*—Stroock & Stroock & Lavan LLP

[57] ABSTRACT

A connector testing system includes a bridge clip having a body and at least one test lead having a fixed end connected to the body and a free end having a projection formed thereon, and a connector having a top portion and a housing having at least one test channel therein. At least one terminal strip is disposed within the connector and a portion of the terminal strip is disposed within the at least one test channel. A flap is connected to the housing for sealing the at least one test channel when the flap is in a first position and for sealing the at least one test channel and securing the bridge clip to the connector at a second position.

28 Claims, 4 Drawing Sheets

CONNECTOR TESTING SYSTEM HAVING CONNECTOR LATCHING

FIELD OF THE INVENTION

This invention relates to the field of telephone wire connector blocks and distribution systems, and specifically to a connector and a test device for testing wiring connected to the connector.

BACKGROUND OF INVENTION

In a telephone network, a network cable from the central office is connected to a building entrance protector (BEP) located at the customer site, where the individual telephone lines are broken out line-by-line. The network cable, which consists of a plurality of tip-ring wire pairs that each represent a telephone line, is typically connected to a connector block that forms a part of the BEP. Such connectors may be, for example, mini rocker tool-less insulation displacement (IDC)-type connectors, such as, for example, those sold by A. C. Egerton, Ltd. Other connectors used for telephony wiring applications are described in U.S. Pat. No. 4,662,699 to Vachhani et al., dated May 5, 1987, and in U.S. Pat. No. 3,611,264 to Ellis, dated Oct. 5, 1971.

The customer telephone equipment is coupled through such an IDC connector to, for example, a central office telephone line. The mini-rocker connector generally has a top portion that includes two wire insertion holes and a bottom section that houses a pair of terminal strips. The wire insertion holes each accommodate one wire of a tip-ring wire pair. The top portion pivots about a generally hinged fixed axis located on the side opposite the wire insertion holes and has a movable clasp member for maintaining the top portion in its closed position.

To open the top portion, a user releases the clasp member and pivots the top portion to its open position. When the top portion is in its open position, the terminal strips do not intersect the wire insertion holes, but when the top portion is in its closed position, the terminal strips intersect the wire insertion holes. Therefore, to establish an electrical and mechanical connection between the wires and the terminal strips, a user first opens the top portion (i.e., pivots the top portion to its open position), inserts the pair of wires, and then closes the top portion. Upon closing the top portion of the connector, the wires are brought into electrical and mechanical contact with the terminal strips. To remove the wires and/or break the electrical connection, the process is reversed.

To verify the integrity of a telephone line, the telephone line may be tested at the connector using a bridge clip. The bridge clip includes a body, a first test prong and a second test prong connected to the body, and lead wires for connecting the first and second test prongs to a testing device, such as a volt meter or telephone test set. The bottom section of the connector includes two insertion channels, each located adjacent a terminal strip and sized to accommodate a test prong of a bridge clip. The test prongs are spaced apart and constructed to be received within the insertion channels.

Testing is typically performed by inserting the test prongs (or leads) of a bridge clip or other probes into the insertion channels of the bottom section of the connector until each of the test prongs contacts an outside edge of one of the pair of terminal strips housed within the bottom section to make an electrical connection. If a current flow is detected, or a dial tone is heard, depending on the test methodology, then a loop condition exists for that particular tip-ring wire pair, and the integrity of the line is verified. If no loop condition is found, either an electrical open or short exists in the telephone line or a connection to or in the terminal block is defective.

The prior art connector has no means of reliably maintaining a secure connection between the bridge clip test prongs and the terminal strips of the connector. Prior art test prongs typically consist of a pair of flexible metallic strips, each of which is bent inwardly at one location so as to bias the tip of the prongs toward the terminal strips. Such a connection is not reliable, however, as the prongs are permitted to freely move within the test channels. As such, when the craftsperson inserts the prongs of the bridge clip into the test channels and performs the test with the testing device, the craftsperson must affirmatively hold the bridge clip to the connector so that the electrical connection is secure. Otherwise, any movement of the bridge clip can cause the test prongs to disengage from the terminal strips, thereby breaking the electrical connection with the terminal strips and causing a false test reading. Further, after repeated use, one or both of the test prongs can bend outwardly thereby causing unreliable connections.

In addition, the prior art connector testing systems do not prevent the user from inadvertently overinserting the test prongs to a position where the prongs cause damage to the connector. Nor do prior art connector testing systems provide a discernible signal to the user when the bridge clip makes contact with the terminal strip to complete an electrical connection.

Finally, prior art connector testing systems permit dust, water and dirt to enter the interior of the connector via the test channels, which are always in an open condition. Such contaminants can hinder the performance of the connector by preventing a proper connection between the bridge clip prongs and the terminal strips and by causing the degradation of connector components.

SUMMARY OF THE INVENTION

The present invention is directed at overcoming the shortcomings of the prior art. A connector testing system for a connector is provided that includes a connector having a housing, a top portion, a flap connected to the housing, at least a first terminal strip disposed within the housing, and a bridge clip having a body, at least one test prong or lead connected to the body at a fixed end, and a projection formed on a free end of the test prong. Preferably, the bridge clip includes two test prongs, each having a projection formed on its free end, and the connector includes two spaced-apart terminal strips disposed within the housing.

To facilitate testing of connections made through the connector, at least one test channel is formed in the housing. A portion of the terminal strip is disposed within the test channel so as to permit a test lead to be inserted into the test channel to make electrical contact with the terminal strip. Preferably, the housing includes two test channels, each test channel having a portion of a respective terminal strip disposed therein.

As described above, the connector includes a first flap having a fixed end connected to the housing, and a free end. The first flap is movable between a first position where the free end of the flap preferably contacts the top portion to seal the test channel and the interior of the connector from outside contaminants, and a second position where the first flap permits a test lead to enter the test channel to make contact with the terminal strip. In the first position, the first flap and the top portion of the connector form a first insertion channel that serves to assist the craftsperson in guiding the test lead to the test channel. In the second position, when the test lead makes electrical contact with the terminal strip, the test lead projection is positioned just below the free end of the first flap to produce positive latching between the bridge clip and the connector. Further, in the second position, the free end of the first flap biases a portion of the free end of the test lead toward the terminal strip. In this manner, the testing system provides a reliable contact between the bridge clip and a terminal strip of the connector during a testing procedure.

In a preferred embodiment, the projection is formed on the test lead at a position along the length of the test lead that assists in preventing the test lead from being overinserted into the connector. In this manner, at the point where the test lead projection passes the free end of the flap, the craftsperson feels or discerns a perceptible signal or "click" that indicates that the test lead is properly positioned within the test channel and a proper electrical connection has been achieved. Once the craftsperson discerns the signal, the craftsperson stops inserting the test lead into the test channel thereby protecting the interior connector components from damage due to overinsertion.

In a preferred embodiment, the connector includes a second flap having a fixed end connected to the housing at a position substantially opposite the position at which the first flap is connected to the housing, and a free end. Similarly to the first flap, the second flap is movable between a first position where the free end of the second flap preferably contacts the top portion to seal the second test channel and the interior of the connector from outside contaminants, and a second position where the second flap permits a test lead to enter the test channel to make contact with the terminal strip. In the first position, the second flap and the top portion of the connector form a second insertion channel that serves to assist the craftsperson in guiding the test lead to the test channel.

Further, as discussed above, in the preferred embodiment, the bridge clip includes a first test lead and a second test lead, each of which include a projection formed on the free end of the test lead. Each test lead is constructed to move one of the first and second flaps from the first position to the second position by causing the free end one of the first and second flaps to move toward the housing. Upon doing so, the craftsperson can further insert the test leads into a respective test channel to make contact with a respective terminal strip. As such, in the second position, when the test leads make electrical contact with respective terminal strips, the test lead projections are positioned just below the free ends of the first and second flaps to produce positive latching between the bridge clip and the connector. In this manner, the testing system provides a reliable contact between the bridge clip and the terminal strips of the connector during testing procedures. Further, the connector provides a seal against outside contaminants during times where testing is being performed and during normal operational conditions.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference numerals depict like elements throughout the several views.

DETAILED DESCRIPTION OF THE PREFERRED EMBODIMENTS

Generally speaking, in accordance the present invention, a connector testing system is provided that provides a more reliable testing configuration.

Figure 3:
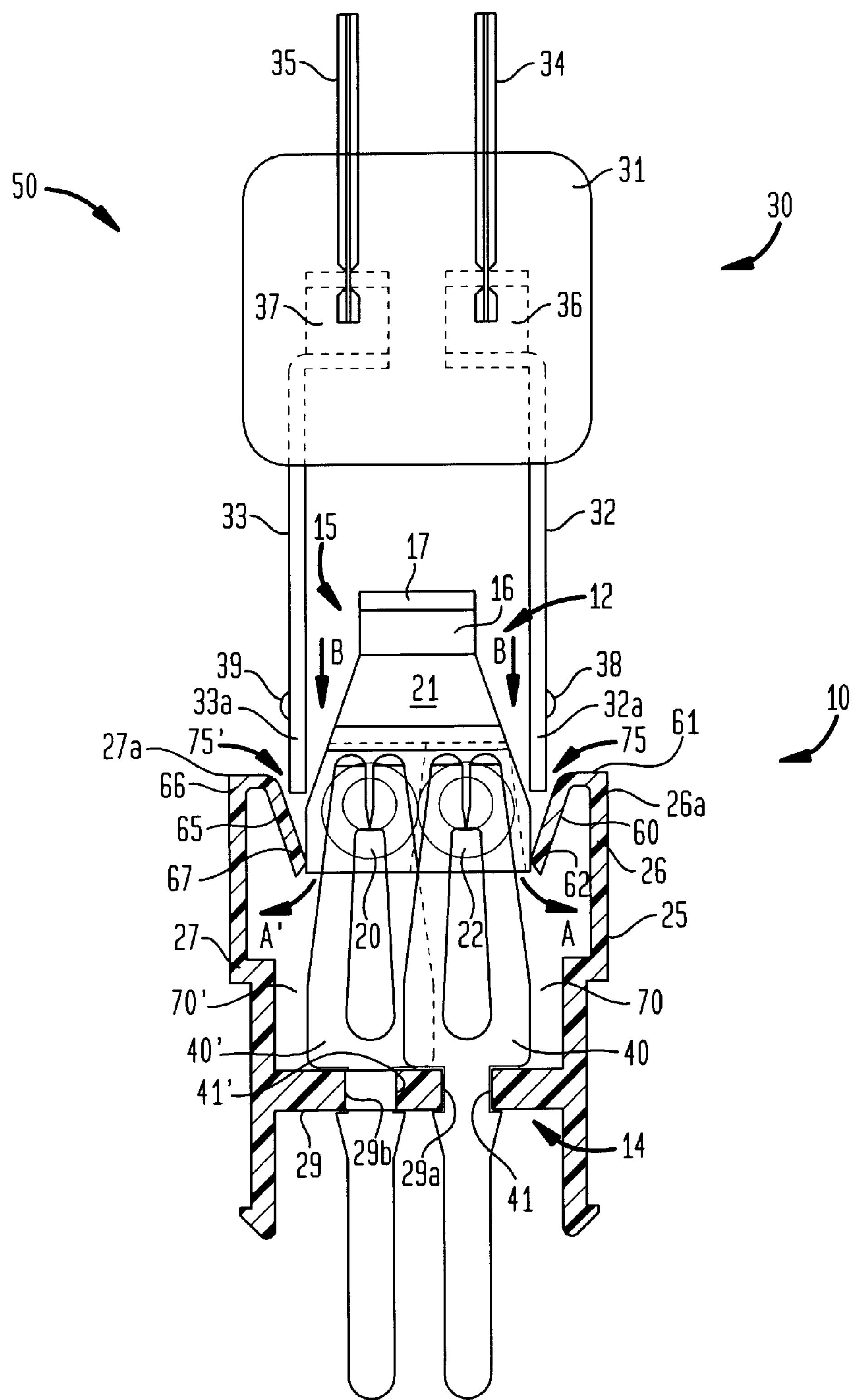
FIG. 3 is a front sectional view of the connector testing system including the connector of FIG. 1 taken along line 3—3 and a bridge clip constructed in accordance with the present invention in the first position.

Referring initially to FIG. 3, a connector testing system 50 includes a connector 10, having a pair of terminal strips 40, 40' and a housing 25, and a bridge clip 30. Terminal strips 40, 40' may be formed of any commonly known electrically conductive metal or electrical conductor known in the art and suitable for use in such terminals, such as, for example, platinum-washed phosphor bronze, or beryllium-copper alloy or any other material, metal or alloy combining good electrical conductivity with sufficient mechanical strength and resilience.

Figure 1:
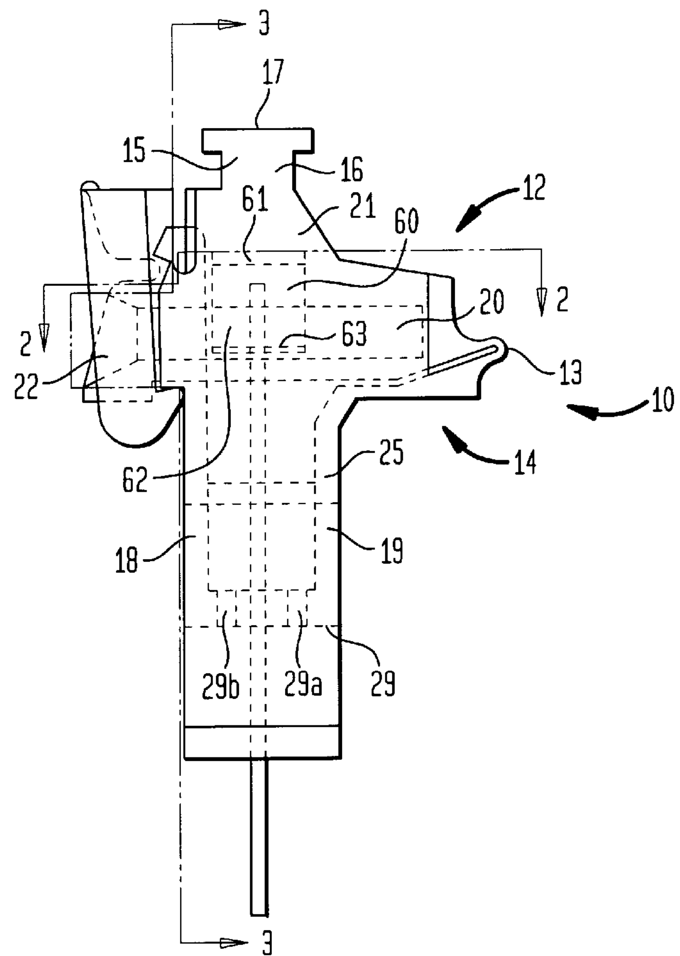
FIG. 1 is a side elevational view of the connector constructed in accordance with the present invention in a first position.
Figure 2:
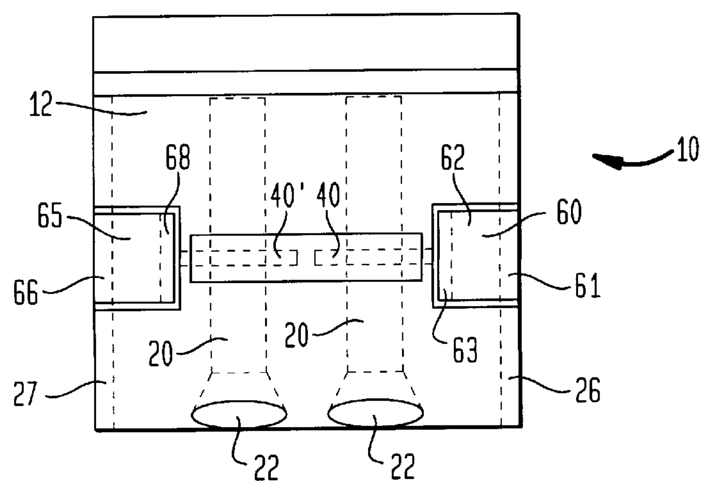
FIG. 2 is a top sectional view of the connector of FIG. 1 taken along line 2—2.

Referring to FIGS. 1–3, connector 10 includes a top portion 12, which is pivotably mounted to bottom section 14 about a hinge 13. Top portion 12 includes a plinth 21, a base 16, which extends upwardly from plinth 21, and a flange 17, which extends outwardly from the top of base 16. Base 16 and flange 17 form a cap 15 preferably having a substantially t-shaped profile when seen from the side elevational view of FIG. 1. Connector 10 has two entrance apertures 22 that lead to wire insertion holes 20. Wire insertion holes 20 are constructed so as to accept electrical conductors (not shown) in a manner known in the art.

Connector 10 also includes housing 25, which is constructed to accept the pair of terminal strips 40, 40' as is shown in each of the figures. Housing 25 includes a first side wall 26, a second side wall 27, a front wall 18 and a rear wall 19, extending between side walls 26, 27, and a bottom wall 29, positioned substantially perpendicular to side walls 26, 27, front wall 18 and rear wall 19 and extending therebetween. Bottom wall 29 has throughholes 29*a*, 29*b* sized to accept snap fit recesses 41, 41' of terminal strips 40, 40', which are secured through the mating engagement of throughholes 29*a*, 29*b* and snap fit recesses 41, 41'. The specific means of affixing terminal strip 40 within connector housing 25 need not be solely by snap fitting as described above, but by numerous methods of affixation known in the art, such as by way of non-limiting example, adhesives, friction fitting, integral molding, screws, and the like, depending on whether ready removal and re-insertion of the terminal strip is required, as a matter of application-specific design choice.

To facilitate testing of connections made through the connector, a first test channel 70 is formed between side wall 26, front wall 18, rear wall 19 and bottom wall 29, and a second test channel 70' is formed between side wall 27, front wall 18, rear wall 19 and bottom wall 29. A portion of terminal strip 40 is disposed within first test channel 70, and a portion of terminal strip 40' is disposed within second test channel 70'.

Referring to FIGS. 1–3, housing 25 of connector 10 includes a first flap 60 connected to a top portion 26*a* of side wall 26. In a preferred embodiment, connector 10 includes first flap 60 and a second flap 65. The construction of second flap 65 is preferably identical to that of first flap 60. While the discussion here will focus on the first flap 60, the same discussion applies to the construction, use and operation of second flap 65. Connector 10 may contain more than two flaps for sealing two or more test channels.

In an alternative embodiment, flap 60 can consist of a side wall of the connector that itself can be biased against top portion. In such an embodiment, the side wall would include a projection on the upper inside surface of the side wall to space the side wall from the top portion and form a test channel. Further, a portion of the side wall would not be connected to the front or rear wall of the connector housing such that the side wall could flex to permit a test lead to be inserted between the projection and the top portion and into the test channel.

Figure 4:
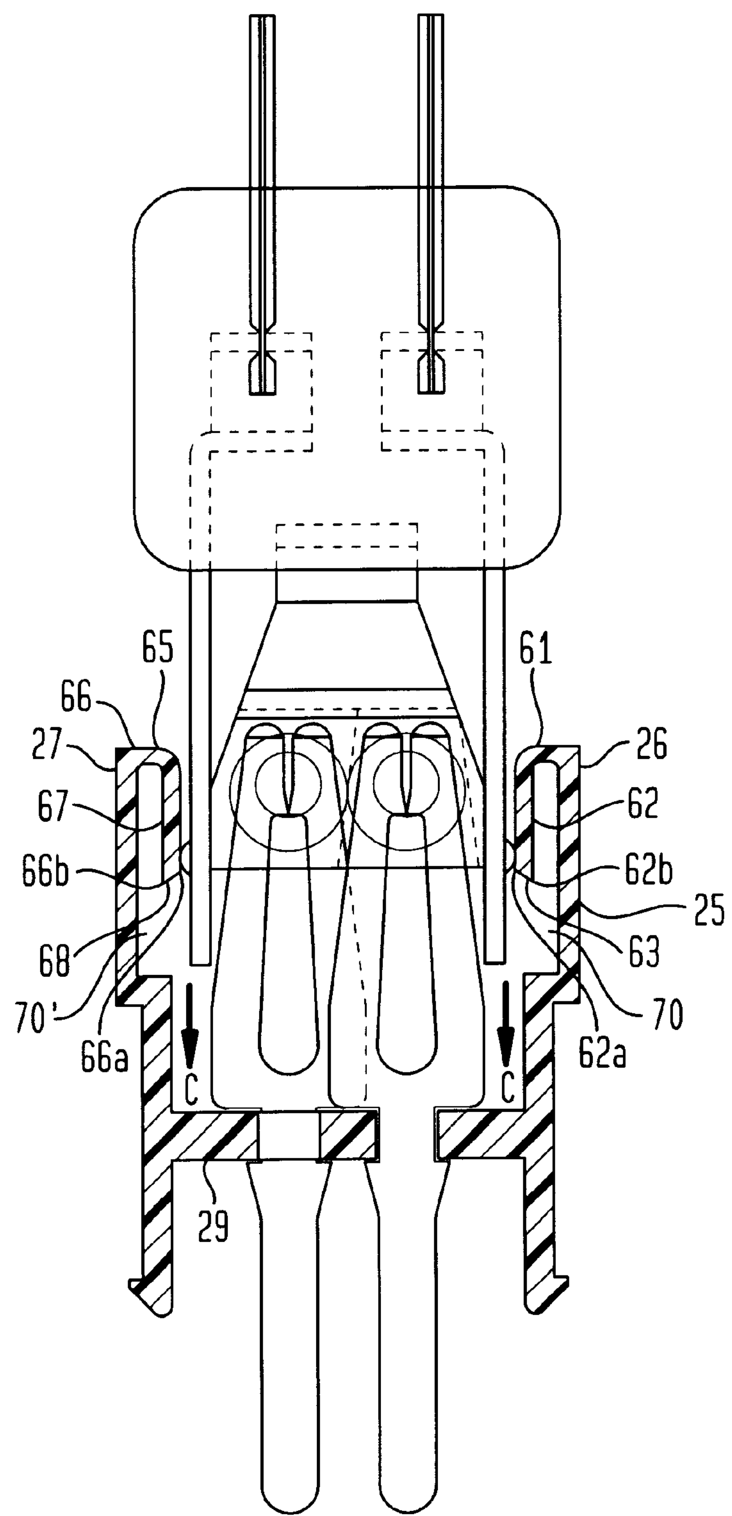
FIG. 4 is a front sectional view of the connector testing system of FIG. 3 in a second position.

Referring in particular to FIG. 3, first flap 60 has a fixed end 61 and a free end 62. First flap 60 is resiliently connected to housing 25 at fixed end 61. In a preferred embodiment, first flap 60 is formed with side wall 26. Free end 62 includes a surface 63, which, as is shown in FIG. 4, is preferably angled from an inside surface 62*a* to a lower outside surface 62*b*. Referring to FIG. 4, when flap 60 is perpendicular to a plane parallel to bottom wall 29, the angle between the surface and the plane preferably ranges between 15° and 45°. In the preferred embodiment, the angle between surface 63 and the plane parallel to bottom wall 29 is about 30°. The angle will vary, however, according to the size of projection 38 and further depending upon the desired force necessary to withdraw test lead 32 from test channel 70, as described below.

Referring to FIG. 2, flap 60 is preferably centered on terminal strip 40 such that flap 60 evenly biases test probe 32 against terminal strip 40 when flap 60 is in the second position as is described below. Terminal strips 40, 40' are shown in a side-by-side configuration in FIG. 2 for purposes of example. However, as is shown in FIG. 3, terminal strips 40, 40' are typically spaced apart in a direction along the length of the wire insertion holes 20. Referring to FIG. 2 (where the gap between top portion 12 and flaps 60, 65 is exaggerated for illustrative purposes), flap 60 preferably is constructed to closely fit with top portion 12. In this way flap 60 prevents contaminants from entering the interior of connector 10 via test channel 70.

Figure 5:
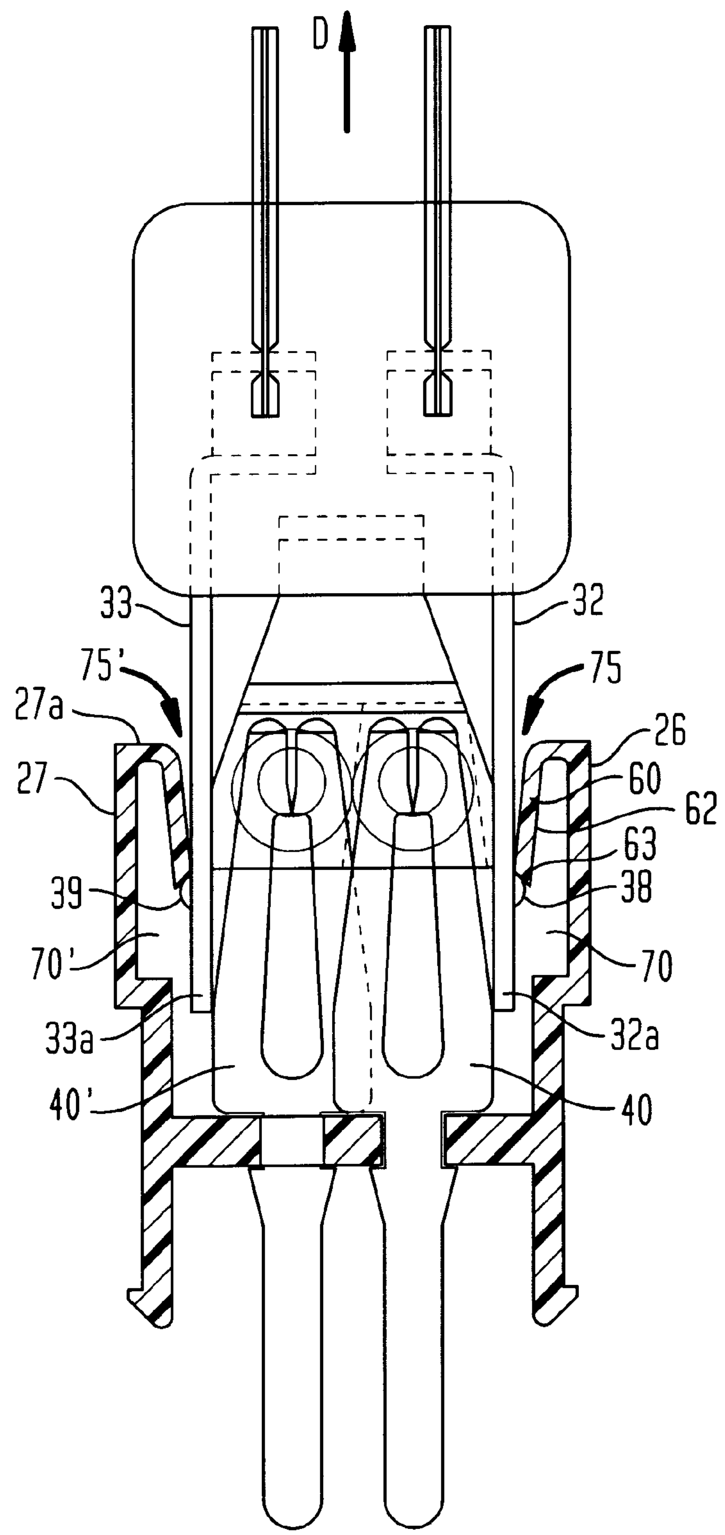
FIG. 5 is a front sectional view of the connector testing system of FIG. 3 in a third position.

First flap 60 is movable from a first position best depicted in FIG. 3, where free end 62 of flap 60 contacts top portion 12 to seal first test channel 70, through an intermediate position depicted in FIG. 4, to a second position depicted in FIG. 5, where free end 62 of flap 60 contacts tip 32*a* of test lead 32 to simultaneously seal test channel 70 and bias test lead 32 toward terminal strip 40 to provide a secure electrical connection. Flap 60 may be constructed such that flap 60 does not bias tip 32*a* toward terminal strip 40. At the first position, free end 62 of first flap 60 forms an insertion channel 75 with top portion 12 of connector 10. Insertion channel 75 serves to guide test lead 32 between flap 60 and top portion 12 and into test channel 70. At the second position, projection 38 is disposed within test channel 70 and abuts surface 63 of flap 60. In this manner, the spring force of flap 60 strain-relieves test lead 32 by biasing surface 63 against the outer surface of test lead 32 or projection 38 or both test lead 32 and projection 38 to prevent the inadvertent withdrawal of test lead 32. As discussed above, the angle of surface 63 may be varied so as to increase the level of strain applied to test lead 32 balancing this variance to facilitate relatively easy removal.

In a preferred embodiment, referring to FIG. 4, second flap 65 includes a fixed end 66 connected to a top portion 27*a* of side wall 27 and a free end 67. Preferably, second flap 65 is resiliently connected to housing 25 at fixed end 66. Second flap 65 is preferably formed with side wall 27, but need not be. Free end 67 includes a surface 68 that is preferably angled from an inside surface 66*a* to a lower outside surface 66*b*.

As with first flap 60, second flap 65 is movable from a first position depicted in FIG. 3, where free end 67 of flap 65 contacts top portion 12 to seal second test channel 70', through an intermediate position depicted in FIG. 4, to a second position depicted in FIG. 5, where free end 67 of flap 65 contacts tip 33*a* of test lead 33 to simultaneously seal test channel 70' and bias test lead 33 toward terminal strip 40' to provide a secure electrical connection. Flap 65 may be constructed such that flap 65 does not bias tip 33*a* toward terminal strip 40'. At the first position, free end 67 of second first flap 65 forms an insertion channel 75' with top portion 12 of connector 10. At the second position, projection 39 is disposed within test channel 70' and abuts surface 68 of flap 65. In this manner, the spring force of flap 65 strain-relieves test lead 33 by biasing surface 68 against the outer surface of test lead 33 or projection 39 to prevent the inadvertent withdrawal of test lead 33 (FIG. 5).

Connector 10, including first flap 60 and second flap 65, is preferably formed of a molded synthetic resinous material with good insulating properties and mechanical strength. The specific materials utilized in constructing connector 10 are an application-specific matter of design choice within the knowledge of the person of skill familiar with wiring connectors and terminal blocks utilized in telephony. Flaps 60 and 65 need not to be forward of the same material as connector 10, but can be formed of any flexible material, such as a metal, a plastic, hard rubber or any resilient material known to those skilled in the art for making an elastic flap of the type shown and described herein. The interior of connector 10 formed by housing 25, first flap 60, second flap 65, and top portion 12 may contain a liquid or gel to protect terminal strips 40, 40' against the entry of dust, water, dirt and other contaminants that can inhibit the proper performance of connector 10.

Referring to FIG. 3, bridge clip 30 is depicted in greater detail. Bridge clip 30 includes a body 31, test leads 32, 33 having respective tips 32*a* and 33*a,* and electrical conductors 34, 35. Test lead 32 and conductor 34 are connected to body 31 at a connection region 36, and test lead 33 and conductor 35 are connected to body 31 at a connection region 37. Test lead 32 forms an electrical connection through connection region 36 and electrical conductor 34 to a testing device (not shown). Likewise, test lead 33 forms an electrical connection through connection region 37 and electrical conductor 35 to the testing device. Test leads 32, 33 are preferably straight, flat electrically conductive blades having projections or protuberances 38, 39, respectively, formed on a lower portion of leads 32, 33. Projections 38, 39 may be formed on the outside surface of test leads 32, 33 by the formation of a dimple on the inner surface of test leads 32, 33. Test leads 32, 33 may be any shape so long as test leads 32, 33 are sized to be accommodated within test channels 70, 70'. For example, a tapered cylinder may also be used. Projections 38, 39 can also be any shape, but preferably are substantially hemispherical and are positioned along the length of test leads 32, 33 such that when projections 38, 39 are disposed within test channels 70, 70', a portion of tips 32*a,* 33*a* contact terminals 40, 40'. Where it is desirable to increase the force required to withdraw test leads 32, 33 from test channel 70, 70', the shape of projections 38, 39 may be altered to more firmly abut surfaces 63, 68 of flaps 60, 65.

As discussed above, bridge clip 30 can be used to verify the integrity of a telephone line. Referring to FIG. 3, to perform testing on the connector and secure bridge clip 30 to connector 10, a craftsperson inserts test leads 32, 33 into insertion channels 75, 75' in a direction indicated by arrows B until tip 32*a* of first test lead 32 and tip 33*a* of second test lead 33 displace first flap 60 and second flap 65 in the direction indicated by the arrows A, A' toward housing side walls 26, 27, respectively. Referring to FIG. 4, once first flap 60 and second flap 65 move a distance sufficient to permit projections 38, 39 to pass between top portion 12 of connector 10 and first flap 60 and second flap 65, the craftsperson can continue to insert test leads 32, 33 until test lead tips 32*a,* 33*a* pass free ends 62, 67 of flaps 60, 65.

As is shown in FIGS. 4 and 5, upon further insertion of test leads 32, 33 in the direction indicated by arrows C, projections 38 and 39 pass below surfaces 63, 68, respectively and the craftsperson may feel or hear a discernible tactile or audible signal or indicator caused when first flap 60 and second flap 65 move over projections 38, 39 and abut against the outer surface of test leads 32, 33 at a position just above projections 38, 39 and/or against projections 38, 39. In this position, tips 32*a* and 33*a* of test leads 32 and 33 are biased to terminals 40, 40' thereby completing an electrical connection between electrical conductors 34, 35 and terminal strips 40, 40' of connector 10. Further, a positive strain relief between bridge clip 30 and connector 10 is provided to eliminate the need for the craftsperson to hold bridge clip 30 to connector 10 during testing. In addition, by providing the craftsperson with an indication that test leads 32, 33 are properly positioned within test channels 70, 70', the craftsperson knows to discontinue inserting test leads 32, 33 into connector 10, thereby protecting connector 10 from damage that might be caused by over insertion of test leads 32, 33. While it is preferable that the craftsperson observe or hear test lead projections 38, 39 move past flaps 60, 65 the craftsperson need not discern this event because, so long as test leads 32, 33 are strain relieved, the craftsperson will feel the increased difficulty with which test leads 32, 33 need be pulled to withdraw the test leads once they are engaged at the second position within test channels 70, 70'.

Thus, if a current flow is detected, or a dial tone is heard, depending on the test methodology, then a loop condition exists for the tip-ring wire pair represented by connector 10 in FIGS. 3–5. In this way the integrity of the telephone line may be verified. On the other hand, if no loop condition is found, either an electrical open or short exists in the telephone line or a connection to or in the terminal block is defective.

During the testing procedure, test channels 70, 70' and the interior of connector 10 are substantially sealed from any outside dust, moisture or contaminant. At the first position depicted at FIG. 3, flaps 60, 65 are held in tension against top portion 12 to substantially block test channels 70, 70'. In the position illustrated in FIG. 4 where test leads 32, 33 pass between top portion 12 and flaps 60, 65, free end 62 of first flap 60 and free end 67 of second flap 65 are biased against first test lead 32 and second test lead 33, respectively. Thus, first test channel 70 and second test channel 70' are also insulated from the exterior of connector 10 at this position. Finally, when test leads 32, 33 are strain-relieved within test channels 70, 70' as shown in FIG. 5, flaps 60, 65 are held in tension against top portion 12 to substantially seal test channels 70, 70'.

When the craftsperson has completed the testing, he or she can move bridge clip 30 in a direction indicated by arrow D in FIG. 5 so as to remove first test lead 32 and second test lead 33 from first test channel 170 and second test channel 170', respectively. When the craftsperson begins to apply the removal force on bridge 30, projections 38, 39 abut surfaces 63, 68 respectively. Surfaces 63, 68 are preferably angled so as to permit projections 38, 39 to displace free ends 62, 67 of test leads 32, 33 toward side walls 26, 27, respectively. When test leads 32, 33 pass from between first flap 60 and second flap 65, flaps 60 and 65 are returned to the first position, as illustrated in FIG. 3. In this position, first free end 62 and second free end 67 contact top portion 12.

Thus, throughout the entire testing procedure, the interior of connector 10 is insulated from any exterior contamination. In this manner, the testing configuration provides a more reliable electrical connection and eliminates the need to hold the bridge clip when testing the electrical conductors housed within the connector. Further, the connector of the present invention may be used in a wiring enclosure, such as, for example, a building entrance protector (BEP) or a network interface unit (NIU).

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A connector testing system, comprising:

a bridge clip having a body and at least one test lead having a test lead fixed end connected to the body on one end of said test lead and a test lead free end having a projection formed thereon;

a connector having a top portion and a housing having at least one test channel formed therein;

at least one terminal strip disposed within the housing and positioned alongside said test channel, the at least one terminal strip having an inner side and an outer side and a portion of said outer side of said terminal strip disposed within the at least one test channel such that said test lead is capable of being disposed within said channel and said test lead free end is capable of contacting said outer side of said terminal strip; and a first flap connected to the housing for substantially sealing the at least one test channel when the first flap is in a first position and in a second position.

2. The connector testing system of claim 1, wherein the first flap secures the bridge clip against the connector at the second position.

3. The connector testing system of claim 1, wherein the projection is disposed substantially within the at least one test channel when the first flap is in the second position.

4. The connector testing system of claim 1, wherein the at least one test lead has an inner surface and an outer surface and the projection is formed on the outer surface of the test lead by the formation of a dimple on the inner surface of the test lead.

5. The connector testing system of claim 1, wherein the first flap has a first flap fixed end and a first flap free end, the fixed end being resiliently connected to said housing.

6. The connector testing system of claim 1, wherein the first flap fixed end is integrally formed with the housing.

7. The connector testing system of claim 5, wherein the free end of the first flap contacts the top portion to seal the at least one test channel when the first flap is in the first position.

8. The connector testing system of claim 5, wherein the free end of the first flap forms an insertion channel with the top portion of the connector when the first flap is in the first position.

9. The connector testing system of claim 1, wherein the first flap biases the at least one test lead against the at least one terminal strip when the first flap is in the second position.

10. The connector testing system of claim 1, wherein the at least one test lead has an inner surface and an outer surface and the projection is formed on the outer surface of the test lead, the first flap has a fixed end and a free end, the fixed end being resiliently connected to said housing, and the free end of the first flap has an angled surface that abuts the projection when the at least one test lead is in the second position.

11. The connector testing system of claim 10, wherein the projection is shaped and sized to slideably engage said angled surface so as to drive the flap toward an intermediate position to permit removal of the test lead from the test channel.

12. The connector testing system of claim 10, wherein the housing includes a bottom wall and the angled surface when perpendicular to a plane parallel to the bottom wall forms an angle with the plane that ranges between about 15°and about 45°.

13. The connector testing system of claim 9, wherein the projection is substantially hemispherical in shape.

14. The connector testing system of claim 5, wherein the first flap is resiliently movable between the first position where the free end of the first flap contacts the top portion to seal the at least one test channel and the second position where the free end of the first flap biases the at least one test lead against the at least one terminal strip.

15. The connector testing system of claim 1, wherein the projection is formed on the at least one test lead at a position along the length of the test lead such that when the first flap is in the second position, the test lead free end contacts the terminal strip.

16. The connector testing system of claim 1, wherein the at least one test lead is a flat, electrically conductive blade.

17. The connector testing system of claim 16, wherein the at least one test lead has an inner surface and an outer surface and the projection is formed on the outer surface of the test lead.

18. The connector testing system of claim 1, wherein said connector is disposed on a connector block.

19. The connector testing system of claim 1, wherein said connector is disposed in a wiring enclosure.

20. A connector testing system, comprising:

a bridge clip having a body and a first test lead and a second test lead, the first test lead having a first test lead fixed end connected to the body and a first test lead free end having a first projection formed thereon, the second test lead having a second test lead fixed end connected to the body and a second test lead free end having a second projection formed thereon;

a connector having a top portion and a housing having a first test channel formed therein and a second test channel formed therein;

a first terminal strip disposed within the housing and positioned alongside said first test channel the first terminal strip having a first inner side and a first outer side and a portion of said first terminal strip disposed within the first test channel such that said first test lead is capable of being disposed within said first test channel and said first test lead free end is capable of contacting said first outer side of said first terminal strip;

a second terminal strip disposed within the housing and positioned alongside said second test channel, the second terminal strip being spaced apart from the first terminal strip and having a second inner side and a second outer side and a portion of said second terminal strip disposed within the second test channel such that said second test lead is capable of being disposed within said second test channel and said second test lead free end is capable of contacting said second outer side of said second terminal strip;

a first flap having a first flap fixed end and a first flap free end, the first flap fixed end being connected to said housing, the first flap sealing the first test channel when the first flap is at a first position and for securing the bridge clip to the connector when the first flap is at a second position; and a second flap having a second flap fixed end and a second flap free end, the second flap fixed end being connected to said housing at a position spaced apart from said first flap fixed end, the second flap sealing the second test channel when the second flap is at a first position and for securing the bridge clip to the connector when the second flap is at a second position.

21. The connector testing system of claim 20, wherein the first projection is disposed within the first test channel and the second projection is disposed within the second test channel when the first flap and the second flap are in the second position.

22. The connector testing system of claim 20, wherein the first free end of the first flap contacts the top portion to seal the first test channel and the second free end of the second flap contacts the top portion to seal the second test channel when the first flap and the second flap are in the first position.

23. The connector testing system of claim 20, wherein the first free end forms a first insertion channel with the top portion of the connector and the second free end forms a second insertion channel with the top portion of the connector when the first flap and the second flap are in the first position.

24. The connector testing system of claim 20, wherein the first flap biases the first test lead against the first terminal strip and the second flap biases the second test lead against the second terminal strip when the first flap and the second flap are in the second position.

25. A connector testing system, comprising:

a connector having a top portion and a housing having at least one test channel formed therein;

at least one terminal strip disposed within the housing and positioned alongside said test channel, the at least one terminal strip having an inner side and an outer side and a portion of said outer side disposed within the at least one test channel; and a bridge clip including a body and at least one test lead having a test lead fixed end connected to the body, and a test lead free end having a projection formed thereon at a position along the length of the test lead such that when the test lead is disposed within the at least one test channel, the test lead free end contacts said outer side of said terminal strip.

26. A method of testing an electrical connection of a connector, comprising the steps of:

providing a connector that includes a top portion and a housing having a test channel formed therein, and a flap resiliently connected to the connector, the flap sealing the test channel and forming an insertion channel with the top portion of the connector when the flap is in a first position;

inserting a test lead having a projection formed thereon into the insertion channel to thereby displace the flap and permit the test lead access to the test channel;

inserting the test lead into the test channel until the projection is disposed within the test channel whereby the test lead contacts a terminal strip positioned alongside said test channel on an outer portion of said terminal strip and the flap moves to a second position to secure the test lead to the connector; and testing the electrical connection of the connector.

27. The method of claim 26, comprising the step of pulling the test lead until the flap moves from the second position to a third position to permit the test lead to be withdrawn from the test channel.

28. The method of claim 27, comprising the step of withdrawing the test lead by further pulling on the test lead until the test lead no longer contacts the flap, whereupon the flap resiliently moves from the third position to the first position to seal the test channel.

* * * * *